United States Patent [19]

Lytle et al.

[11] Patent Number: 5,028,454
[45] Date of Patent: Jul. 2, 1991

[54] ELECTROLESS PLATING OF PORTIONS OF SEMICONDUCTOR DEVICES AND THE LIKE

[75] Inventors: William H. Lytle, Chandler; Dennis R. Olsen, Scottsdale, both of Ariz.

[73] Assignee: Motorola Inc., Schaumburg, Ill.

[21] Appl. No.: 422,195

[22] Filed: Oct. 16, 1989

[51] Int. Cl.⁵ .............................................. C23C 26/00
[52] U.S. Cl. ..................................... 427/123; 427/125
[58] Field of Search ................................ 427/123, 125

[56] References Cited

U.S. PATENT DOCUMENTS

| | | | |
|---|---|---|---|
| 3,453,501 | 7/1969 | Dunkle | 357/71 |
| 3,537,878 | 11/1970 | Bandrand | 427/305 |
| 3,672,939 | 6/1972 | Miller | 427/305 |
| 3,729,807 | 5/1973 | Fujiwara | 427/125 |
| 3,956,528 | 5/1976 | Ugro | 427/125 |
| 4,339,476 | 7/1982 | Feldstein | 427/305 |
| 4,349,585 | 9/1982 | Nagashima | 427/123 |
| 4,567,066 | 1/1986 | Schultz | 417/305 |

FOREIGN PATENT DOCUMENTS 166872 2/1956 Australia .............................. 427/123

OTHER PUBLICATIONS

"The Electromotive Series for Metals and Alloys" Metal Finishing, vol. 50, No. 4, Apr., 1952, p. 89.

Primary Examiner—Shrive P. Beck
Assistant Examiner—Vi Duong Dang
Attorney, Agent, or Firm—Harry A. Wolin

[57] ABSTRACT

A method for electrolessly plating portions of semiconductor devices and the like comprises the steps of providing a first metal having a higher electromotive series than a coating metal, galvanically coupling a second metal to the first metal wherein a portion of the first metal remains exposed and then subjecting the second metal and the exposed portion of the first metal to an electroless coating metal plating solution. The method employs no masks and is ideal for plating small areas such as single ball bonds and limited numbers of ball bonds on a single semiconductor chip.

19 Claims, 1 Drawing Sheet

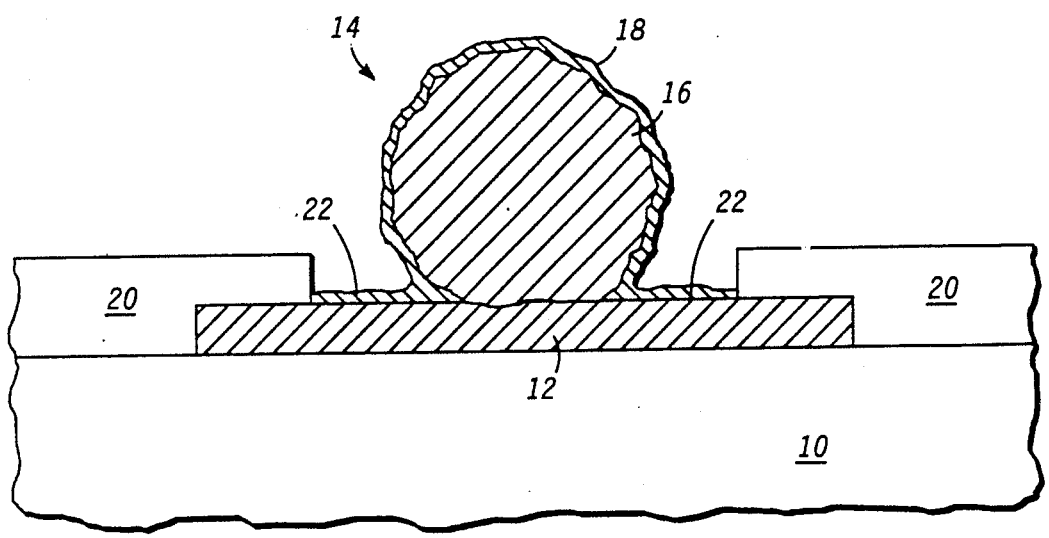

ELECTROLESS PLATING OF PORTIONS OF SEMICONDUCTOR DEVICES AND THE LIKE

BACKGROUND OF THE INVENTION

This invention relates, in general, to semiconductor devices, and more particularly to a method of electrolessly plating portions of semiconductor devices and the like.

It is desirable to plate portions of semiconductor devices and the like for many applications. This is especially true in the area of semiconductor package assembly where noble metals are often used to form ball bonds. However, the use of noble metals for ball bonds has serious detrimental effects. For example, it is often required that metal ball bonds be solder coated and noble metals such as gold have a very high dissolution rate in solder. This makes the noble metal extremely difficult to use.

If a metal such as nickel that has an extremely low dissolution rate in solder could be plated on a noble metal to obtain the most favorable characteristics of both metals, an excellent ball bond could be fabricated. However, noble metals generally are not chemically active enough to initiate electroless nickel deposition alone. Prior art methods of plating noble metals with nickel have included the use of a catalyst such as palladium chloride. However, the palladium chloride catalyst activates surfaces other than that of the ball bond and therefore, surfaces where plating is undesirable must be masked to prevent plating thereon. This makes it very difficult to plate small surfaces such as single ball bonds, a limited number of ball bonds on a single chip and other surfaces where it would be impractical, expensive and time consuming to employ a mask.

Flis et al. in an article entitled "Initiation of Electroless Nickel Plating on Copper, Palladium-Activated Copper, Gold, and Platinum", J. Electrochem.Soc.: Electrochemical Science and Technology, Vol. 131, No. 2, Page 254, February 1984, measured electrical activity at early states of nickel plating. They found that palladium-activated copper and gold were catalytically active and disclosed a plating solution comprising sodium hypophosphite, nickel sulphate, potassium sodium tartrate, ammonium hydroxide and sulfuric acid. However, the method disclosed by Flis et al. is not able to plate an appreciable amount of nickel on noble metals that were not palladium-activated.

Plating initiated by an outside electrical driving force is well known in the art. However, outside driving forces generally activate entire surfaces and therefore, plating of undesired surfaces is prevalent. As a result, masks, which again are often impractical in the plating of small surfaces, must be employed.

In view of the above, it would be highly desirable to have a method for electrolessly plating semiconductor devices and the like that requires no masks, relatively little time and is inexpensive.

SUMMARY OF THE INVENTION

Accordingly, it is an object of the present invention to provide a method for electrolessly plating portions of semiconductor devices and the like wherein no masks are employed.

Another object of this invention is to provide a method for electrolessly plating portions of semiconductor devices and the like that will allow the use of existing ball bond equipment.

It is an additional object of the present invention to provide a method for electrolessly plating portions of semiconductor devices and the like to produce noble metal ball bonds that may be solder coated without damage to the noble metal.

A further object of the present invention is to provide a method for electrolessly plating portions of semiconductor devices and the like wherein small areas may be easily plated.

The foregoing and other objects and advantages are achieved in the present invention by one embodiment in which, as a part thereof, includes providing a bond pad having a higher electromotive series than nickel. A noble metal ball bond is then galvanically coupled to the bond pad so that at least a portion of the bond pad remains exposed. The noble metal ball bond and exposed portion of the bond pad are then subjected to an electroless nickel plating solution comprising nickel sulphate, sodium hypophosphite, potassium sodium tartrate and ammonium hydroxide until a predetermined amount of nickel has been plated on the noble metal ball bond.

A more complete understanding of the present invention can be attained by considering the following detailed description in conjunction with the accompanying drawing.

BRIEF DESCRIPTION OF THE DRAWING

The sole FIGURE is a highly enlarged cross-sectional view of a ball bond embodying the present invention.

DETAILED DESCRIPTION OF THE INVENTION

The FIGURE illustrates a highly enlarged cross-sectional view of a ball bond embodying the present invention. The FIGURE includes a substrate 10 that may comprise a portion of a semiconductor device or integrated circuit as is well known in the art. A bond pad 12 comprised of a first metal is formed on substrate 10 and serves as a contact to the inner-metallization disposed in or on substrate 10. A ball bond 14 comprising a second metal 16 plated with coating metal 18 is disposed on bond pad 12. Ball bond 14 serves as an electrical contact and mounting surface for the semiconductor device or integrated circuit. The FIGURE also includes passivation 20 which is comprised of a well known glass in this embodiment. Although a ball bond is depicted herein, it should be understood that the present invention is a method of electrolessly plating portions of semiconductor devices and the like and may be utilized in numerous applications not disclosed in this document.

Initially, a first metal, bond pad 12 in this embodiment, is provided. If second metal 16 is to be a noble metal, it is essential that the first metal have a higher electromotive series than coating metal 18. Although the first metal is aluminum in this embodiment, other metals including refractory metals, refractory metal alloys and compounds and aluminum alloys may also be employed. Once aluminum bond pad 12 has been provided, a second metal 16, a noble metal herein, is galvanically coupled thereto. Although noble metal 16 may comprise silver, copper, platinum or palladium, gold is employed in this embodiment. Gold 16 is galvanically coupled to aluminum bond pad 12 by thermosonic bonding or thermocompression as is well known in the art. The ultrasonic energy helps break the native oxide which generally forms on aluminum thereby allowing adequate bonding and galvanic coupling between aluminum bond pad 12 and gold 16. It is important that portions 22 of bond pad 12 remain exposed following the galvanic coupling of gold 16.

Exposed portions 22 of aluminum bond pad 12 will generally have native oxide disposed thereon. In order for coating metal 18 to adequately plate, this native oxide must be replaced so that the aluminum of bond pad 12 is chemically active. To do this a zincating solution is generally applied to replace the native oxide. Although zincating solutions are well known in the art, the solution employed in the present invention is Fidelity 3116 comprising sodium hydroxide (NaOH) and zinc sulfate ($ZnSO_4$). Additionally, the formation of a thin layer of zinc on aluminum bond pad 12 prevents the oxidation of aluminum bond pad 12.

Once the zincating solution has been employed, gold 16 and aluminum bond pad 12 are subjected to an electroless plating solution including coating metal 18. In this embodiment, coating metal 18 comprises nickel. Although many nickel plating solutions are known in the art and may be employed, a solution comprising nickel sulfate ($NiSO_4$) as a nickel source, sodium hypophosphite ($NaH_2PO_2$) as a reducing agent, potassium sodium tartrate ($KNaC_4H_4O_6$) as a buffer and ammonium hydroxide ($NH_4OH$) to maintain a pH in the range of 6.0 to 8.0 is employed herein. It is also important to maintain the solution at a temperature in the range of 65 to 75 degrees centigrade during the actual plating. A specific mixture includes 13.21 grams per liter of sodium hypophosphite, 13.1 grams per liter of nickel sulfate in water and 28.2 grams per liter of potassium sodium tartrate and water. It should be understood that aluminum bond pad 12 and noble metal 16 should be subjected to the electroless nickel plating solution until the desired thickness of nickel 18 has been plated thereon and an ideal ball bond 14 has been formed.

In the present invention, the galvanic coupling of bond pad 12 and gold 16 allows gold 16 to assume the electrical characteristics of aluminum. The plating begins on the zincated aluminum surface of bond pad 12 and then continues around gold 16 to form plated ball bond 14. The electroless plating disclosed herein is selective and nickel 18 will only plate on surfaces having electrical activity, bond pad 12 and galvanically coupled gold 16 in this embodiment. The selective nature of the plating method disclosed herein makes it ideal for plating small areas such as single ball bonds, limited numbers of ball bonds on a single chip and other surfaces where it would be impractical, expensive and time consuming to employ a mask.

The nickel plating of a noble metal ball bond as disclosed herein allows for solder dipping of noble metal ball bond without dissolution and without the need to develop new ball bond equipment. Additionally, it should be understood that the present invention may be utilized aside from ball bonds and that metals other than those disclosed herein may be employed.

Thus it is apparent that there has been provided, in accordance with the invention, an improved method for electrolessly plating semiconductor devices and the like which includes galvanically coupling a second metal to a first metal having a higher electromotive series than a coating metal and subjecting the coating metal and exposed portions of the first metal to an electroless coating metal plating solution. This method meets the objects and advantages set forth above. While specific embodiments of the present invention have been shown and described, further modifications and improvements will occur to those skilled in the art. It is desired that it be understood, therefore, that this invention is not limited to the particular form shown and it is intended in the appended claims to cover all modifications which do not depart from the spirit and scope of this invention.

What is claimed is:

1. A method for electrolessly plating portions of semiconductor devices and the like comprising the steps of:
   providing a first metal having a higher electromotive series than a coating metal;
   galvanically coupling a second metal to said first metal wherein at least a portion of said first metal remains exposed; and
   subjecting said second metal and said exposed portion of said first metal to an electroless coating metal plating solution.

2. The method of claim 1 wherein the first metal is a member of the group comprising aluminum, aluminum alloys, refractory metals and refractory metal alloys and compounds.

3. The method of claim 2 wherein the second metal is a noble metal and a member of the group comprising gold, silver, copper, platinum and palladium.

4. The method of claim 3 wherein the coating metal comprises nickel.

5. The method of claim 2 further comprising activating the first metal prior to the subjecting step by using a zincating solution.

6. The method of claim 5 wherein the zincating solution comprises sodium hydroxide and zinc sulfate.

7. The method of claim 4 wherein the electroless nickel plating solution comprises nickel sulfate, sodium hypophosphite, potassium sodium tartrate and ammonium hydroxide.

8. The method of claim 7 wherein the subjecting step occurs at a temperature in the range of 65 to 75 degrees centigrade and at a pH in the range of 6.0 to 8.0.

9. A method for electrolessly plating nickel on gold comprising the steps of:
   providing aluminum metal;
   galvanically coupling gold to said aluminium metal wherein at least a portion of said aluminum metal remains exposed;
   subjecting at least said exposed aluminum metal to a zincating solution; and
   subjecting said gold and said aluminum metal to an electroless nickel plating solution.

10. The method of claim 9 wherein the zincating solution comprises sodium hydroxide and zinc sulfate.

11. The method of claim 9 wherein the electroless nickel plating solution comprises nickel sulfate, sodium hypophosphite, potassium sodium tartrate and ammonium hydroxide.

12. The method of claim 11 wherein the subjecting said gold step occurs at a temperature in the range of 65 to 75 degrees centigrade and at a pH in the range of 6.0 to 8.0.

13. A method of plating nickel on a noble metal ball bond comprising the steps of:
   providing a noble metal ball bond galvanically coupled to a bond pad comprised of a first metal wherein at least a portion of said bond pad remains exposed, said first metal having a higher electromotive series than nickel; and subjecting said noble metal ball bond and said exposed portion of said first metal bond pad to an electroless nickel plating solution.

14. The method of claim 13 wherein the first metal bond pad is a member of the group comprising aluminum, aluminum alloys, refractory metals and refractory metal alloys and compounds.

15. The method of claim 14 wherein the noble metal ball bond is a member of the group comprising gold, silver, copper, platinum and palladium.

16. The method of claim 14 further comprising activating the first metal bond pad prior to the subjecting step by using a zincating solution.

17. The method of claim 16 wherein the zincating solution comprises sodium hydroxide and zinc sulphate.

18. The method of claim 15 wherein the electroless nickel plating solution comprises nickel sulfate, sodium hypophosphite, potassium sodium tartrate and ammonium hydroxide.

19. The method claim 18 wherein the subjecting step occurs at a temperature in the range of 65 to 75 degrees centigrade and at a pH in the range of 6.0 to 8.0.

* * * * *